United States Patent [19]

Fujii et al.

[11] Patent Number: 4,686,168

[45] Date of Patent: Aug. 11, 1987

[54] FLUOROALKYL ACRYLATE RESIST MATERIAL AND PROCESS FOR FORMING FINE RESIST PATTERN

[75] Inventors: Tsuneo Fujii, Suita; Hiroshi Inukai, Takatsuki; Takayuki Deguchi, Ibaraki; Toshihiko Amano, Settsu; Masami Kakuchi, Katsuta; Hiroshi Asakawa; Osamu Kogure, both of Mito, all of Japan

[73] Assignees: Daikin Kogyo Co., Ltd., Osaka; Nippon Telegraph & Telephone Public Corporation, Tokyo, both of Japan

[21] Appl. No.: 710,190

[22] Filed: Mar. 11, 1985

Related U.S. Application Data

[62] Division of Ser. No. 450,726, Dec. 17, 1982, Pat. No. 4,539,250.

[30] Foreign Application Priority Data

Dec. 19, 1981 [JP]  Japan ................. 56-205877
Dec. 19, 1981 [JP]  Japan ................. 56-205876
Dec. 26, 1981 [JP]  Japan ................. 56-212730
Dec. 26, 1981 [JP]  Japan ................. 56-212729

[51] Int. Cl.$^4$ .............................................. G03C 5/00
[52] U.S. Cl. ................................. 430/326; 430/270; 430/296; 430/331
[58] Field of Search ............................ 430/296, 326

[56] References Cited

U.S. PATENT DOCUMENTS 4,262,081  4/1981  Bowden et al. ............... 430/296
4,421,843  12/1983  Hattori et al. ................. 430/296

*Primary Examiner*—Joseph L. Schofer
*Assistant Examiner*—Peter F. Kulkosky
*Attorney, Agent, or Firm*—Armstrong, Nikaido, Marmelstein & Kubovcik

[57] ABSTRACT

A resist material of positive type having a high sensitivity, a high resolving power and an excellent adhesion property to substrates, which comprises a copolymer of a fluoroalkyl acrylate having the general formula:

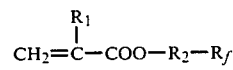

wherein $R_1$ is methyl group, ethyl group, a halogen-substituted methyl or ethyl group, a halogen atom or hydrogen atom, $R_2$ is a bivalent hydrocarbon group having 1 to 6 carbon atoms, and $R_f$ is a fluoroalkyl group having 1 to 15 carbon atoms, with an acrylic comonomer selected from the group consisting of a glycidyl acrylate, an acrylic acid, an acrylamide and an α-cyanoacrylate.

9 Claims, 7 Drawing Figures

FLUOROALKYL ACRYLATE RESIST MATERIAL AND PROCESS FOR FORMING FINE RESIST PATTERN

This is a division of pending application Ser. No. 450,726, filed Dec. 17, 1982, now U.S. Pat. No. 4,539,250.

BACKGROUND OF THE INVENTION

The present invention relates to a resist material of positive type of rhigh energy rays lithography and a process for forming a fine resist pattern by using the resist material.

A photoresist delineable with visible rays or near ultraviolet has hitherto been employed as a pattern-forming material in the fields such as masking and production of semiconductor elements, and such a resist has been sufficient to obtain openings on the order of several micronmeters. In recent years, however, finer and finer patterns are desired with demands for decreasing the weight and increasing the capacity of electronic parts, and therefore it is necessary to obtain openings of less than several micronmeters, particularly less than 1 $\mu$m.

The conventional photoresist material utilizing longer wave length rays such as visible rays is not applicable to the formation of a fine pattern of several $\mu$m. to 1 $\mu$m. or less, and consequently a resist material utilizing high energy rays such as far ultraviolet rays, X-rays and electron beams has been developed for enabling the formation of a fine pattern. In such resist materials, the most widely employed is polymethyl methacrylate. It has high resolution, but low sensitivity. For instance, the sensitivity to L-line of Mo which is soft X-rays is 1,300 mJ/cm.$^2$, and the sensitivity to electron beam is $1\times10^{-4}$ coulomb/cm.$^2$ Therefore, it takes a long period of time to form a pattern.

Also, it is proposed in U.S. Pat. No. 4,125,672 to employ homopolymers of fluoroalkyl methacrylates as resist materials for high energy rays. This resist material is improved in sensitivity in comparison to polymethyl methacrylate but often shows poor adhesion property to a certain kind of substrate such as silicon substrate which results in lowering accuracy. For instance, upon development, peeling off or blister of the resist film occurs, due to soaking of a developer into the interface between the resist film and the substrate, and as a result, the concaved portion formed in the substrate by etching, etc. has a larger size than the predetermined size. In some cases, such a drawback is eliminated by post-baking, but in most cases, it can be eliminated insufficiently.

It is an object of the present invention to provide a resist material of positive type having high sensitivity, high resolution and excellent adhesion property.

A further object of the invention is to provide a resist material capable of forming a fine pattern.

Another object of the invention is to provide a process for forming a fine resist pattern.

These and other objects of the present invention will become apparent from the description hereinafter.

SUMMARY OF THE INVENTION

In accordance with the present invention, there is provided a resist material which comprises a copolymer of a fluoroalkyl acrylate having the general formula (I):

wherein $R_1$ is methyl group, ethyl group, a halogen-substituted methyl or ethyl group, a halogen atom or hydrogen atom, $R_2$ is a bivalent hydrocarbon group having 1 to 6 carbon atoms, and $R_f$ is a fluoroalkyl group having 1 to 15 carbon atoms, and an acrylic comonomer selected from the group consisting of a glycidyl acrylate having the general formula (II):

wherein $R_3$ is hydrogen atom, methyl group or ethyl group, an acrylic acid having the general formula (III):

wherein $R_3$ is as defined above,
and acrylamide having the general formula (IV):

wherein $R_3$ is as defined above,
and an $\alpha$-cyanoacrylate having the general formula (V):

wherein $R_4$ is hydrogen atom or an alkyl group having 1 to 5 carbon atoms.

The fluoroalkyl acrylate copolymer has high sensitivity to high energy rays, high resolution and excellent adhesion property to substrates, and accordingly is very useful as a resist material capable of forming a fine resist pattern.

DETAILED DESCRIPTION

Representative examples of the fluoroalkyl acrylate of the general formula (I) used in the present invention are given below.

-continued $$CH_2=C(CH_3)COOCH_2CF_2CF_2CF_2CHF_2$$

$$CH_2=C(CH_3)COOC(CH_3)_2CF_2CHF_2$$

$$CH_2=C(CH_3)COOC(CH_3)_2CF_2CF_2CF_2CHF_2$$

$$CH_2=CClCOOCH_2CF_2CHF_2$$

$$CH_2=C(CH_3)COOCH_2CF_2CHFCF_3$$

$$CH_2=C(CH_3)COOCH(CH_3)CF_2CHFCF_3$$

$$CH_2=C(CH_3)COOCH(C_2H_5)CF_2CHFCF_3$$

$$CH_2=C(CH_3)COOCH(C_3H_7)CF_2CHFCF_3$$

$$CH_2=C(CH_3)COOC(CH_3)_2CF_2CHFCF_3$$

$$CH_2=C(CH_3)COOC(C_2H_5)(CH_3)CF_2CHFCF_3$$

$$CH_2=C(CH_3)COOC(H)(CH_3)CH_2CF_2CHFCF_3$$

$$CH_2=C(CH_3)COOCH_2CH_2CF_2CF_2CF_3$$

$$CH_2=C(CH_3)COOCH_2CH_2(CF_2CF_2)_2CF_3$$

The ratio of the fluoroalkyl acrylate (I) to the acrylic comonomer in the copolymer is from 60:40 to 99.9:0.1 by mole, preferably 80:20 to 99.9:0.1 by mole. The higher the content of the acrylic comonomer, the most excellent the adhesion property of the copolymer, but to the contrary, the lower the sensitivity and resolution. Within the above range, the sensitivity and resolution are not lowered to such a degree as causing troubles in practical use and also the adhesion property is sufficient.

The weight average molecular weight of the copolymer is 10,000 to 20,000,000, preferably 50,000 to 10,000,000. The larger the molecular weight of the copolymer, the larger the difference in rate of dissolution between the portion irradiated with high energy rays and the portion unirradiated, thus the more the sensitivity and resolution are improved.

The copolymer of the present invention is prepared by copolymerizing the fluoroalkyl acrylate (I) with the acrylic comonomer in the presence of a usual polymerization initiator in a known method such as bulk polymerization, solution polymerization, emulsion polymerization or suspension polymerization. The degree of polymerization of the copolymer to be produced can be adjusted in a usual manner, for instance, by adjusting the amount of an initiator or the polymerization temperature.

A resist film of the copolymer of the present invention can be formed on a substrate by a general method for forming a resist film. That is to say, from the copolymer, a resist film is formed by dissolving the copolymer in a solvent such as aliphatic ketones, aliphatic alcohols, aliphatic esters, aliphatic ethers, aromatic hydrocarbons, alicyclic ketones, halogenated hydrocarbons or mixtures thereof to give a resist solution, coating the resist solution on a substrate, for instance, with a spin coater, and completely evaporating the solvent.

For the resist material according to the invention, substrates are not particularly limited, and various kinds of substrates can be used, e.g. a substrate masked with chromium, silicon, silicon dioxide, a silicate glass, silicon nitride, aluminum, titanium and gold. The resist film of the material according to the present invention shows an excellent adhesion property to any substrates.

A resist film obtained from the resist material of the present invention is delineable with high energy rays such as electron beam, ultraviolet rays having a wave length of not more than 300 nm., far ultraviolet rays and X-rays. A fine resist pattern can be formed by irradiating the resist film with high energy rays to delineate a pattern, and developing it with a developer.

Solvents used as a developer for a resist film prepared from the resist material of the invention are those showing a large difference in the rate of dissolution between the irradiated portion where the molecular weight is decreased and the unirradiated portion where the high molecular weight is maintained. In case of the copolymers of fluoroalkyl acrylates (I) with glycidyl acrylates (II) of α-cyanoacrylates (V), solvents suitable as developers are (A) alcohols having 3 to 8 carbon atoms which may be employed alone or in admixture thereof, and (B) mixtures of (i) at least one organic solvent selected from the group consisting of ketones such as methyl ethyl ketone and methyl isobutyl ketone, alkyl cellosolves having a $C_1$ to $C_5$ alkyl group, and alkyl alkanates having a $C_1$ to $C_5$ alkyl group and a $C_1$ to $C_5$ alkanate group, with (ii) one or more kinds of alcohols having 3 to 8 carbon atoms. In the above mixtures (B), preferable components (i) are methyl isobutyl ketone, methyl cellosolve, ethyl cellosolve, methyl cellosolve acetate and ethyl cellosolve acetate, and preferable components (ii) are isopropyl alcohol and n-propyl alcohol. The mixing ratio of the components (i) and (ii) is suitably selected depending on the molecular weight of the copolymer or the desired sensitivity. In case of the copolymers of fluoroalkyl acrylates (I) with acrylic acids (II) or acrylamides (III), solvents suitable as developers are (C) alcohols having 2 to 8 carbon atoms which may be employed alone or in admixture thereof, and (D) mixtures of (i) one or more kinds of alcohols having 2 to 8 carbon atoms with (ii) one or more kinds of aliphatic and aromatic hydrocarbons having 5 to 11 carbon atoms or water. In the above mixtures (D), preferable components (i) are isopropyl alcohol and n-propyl alcohol, and preferable components (ii) are hexane, heptane, octane, nonane, benzene, cyclohexane and water. The mixing ratio of the components (i) and (ii) is suitably determined according to the molecular weight of the copolymer or the desired sensitivity. The developing temperature and the developing time are suitably determined according to the kind of the developer and the molecular weight of the copolymer used as a resist material.

After the delineation and subsequent development, and developed pattern is dried and baked, thus forming a desired fine resist pattern.

The present invention is more specifically described and explained by means of the following Reference Examples, Examples and Comparative Examples, in which all parts are by weight unless otherwise noted. It is to be understood that the present invention is not limited to the Examples, and various changes and modifications may be made in the invention without departing from the spirit and scope thereof.

REFERENCE EXAMPLE 1

To 12 parts of methacrylic acid chloride were added 60 parts of 2,2,3,4,4,4-hexafluorobutyl alcohol as a reactant and a solvent and 0.1 part of hydroquinone dimethyl ether as a polymerization inhibitor. The mixture was heated at a temperature of 90° to 100° C. for 3 hours. The reaction mixture was distilled to give 15 parts of 2,2,3,4,4,4-hexafluorobutyl methacrylate (hereinafter referred to as "HFBMA") having a boiling point of 60° to 63° C./20 mmHg.

To 95 parts (91.5 parts by mole) of HFBMA were added 5 parts (8.5 parts by mole) of glycidyl methacrylate (hereinafter referred to as "GMA"), 0.1 part of azobisisobutyronitrile (hereinafter referred to as "AIBN") and 150 parts of methyl isobutyl ketone, and they were mixed. After conducting freeze-degasing of the mixture, copolymerization was carried out at 60° C. for 24 hours. Acetone was added to the reaction mixture to give a uniform solution, and petroleum ether was added to the solution to precipitate a copolymer, thus 52 parts of the copolymer was obtained.

It was confirmed by pyrolysis gas chromatography that the obtained copolymer contained 9.3% by mole of GMA monomer units and had approximately the same composition as that of the charged monomers. The intrinsic viscosity [$\eta$] of the copolymer was 0.82 dl./g. (at 35° C. in methyl ethyl ketone), and the weight average molecular weight measured by gel permeation chromatography was about 890,000.

REFERENCE EXAMPLE 2

The procedure of Reference Example 1 was repeated except that HFBMA and GMA were employed in amounts of 99 parts (98.3 parts by mole) and 1 part (1.7 parts by mole), respectively, to give 51 parts of a copolymer.

The copolymer had an intrinsic viscosity [$\eta$] of 1.06 dl./g. and a weight average molecular weight of about 1,200,000.

REFERENCE EXAMPLES 3 TO 7

The procedure of Reference Example 1 was repeated except that the amounts of HFBMA, GMA and AIBN and the polymerization temperature were changed as shown in Table 1. The intrinsic viscosity [$\eta$] of the copolymers and the weight average molecular weight of the copolymers having a large intrinsic viscosity were measured in the same manner as in Reference Example 1.

The results are shown in Table 1.

TABLE 1

| Ref. Ex. No. | HFBMA part | HFBMA part by mole | GMA part | GMA part by mole | AIBN part | Polymerization temp. °C. | [$\eta$] dl./g. | Weight average molecular weight |
|---|---|---|---|---|---|---|---|---|
| 3 | 99.5 | 99.13 | 0.5 | 0.87 | 0.1 | 60 | 1.01 | — |
| 4 | 98.5 | 97.4 | 1.5 | 2.6 | 0.1 | 60 | 0.95 | — |
| 5 | 88 | 80.6 | 12 | 19.4 | 0.1 | 60 | 0.86 | — |
| 6 | 99 | 98.3 | 1 | 1.7 | 0.05 | 60 | 1.39 | about 1,700,000 |
| 7 | 99 | 98.3 | 1 | 1.7 | 0.05 | 50 | 2.4 | about 5,200,000 |

REFERENCE EXAMPLES 8 TO 10

The procedure of Reference Example 1 was repeated except that 99 parts of the fluoroalkyl acrylate shown in Table 2 and 1 part of GMA were employed. The intrinsic viscosity [$\eta$] of the obtained copolymers was measured in the same manner as in Reference Example 1.

The results are shown in Table 2 with the second order transition points (Tg) of the copolymers.

TABLE 2

| Ref. Ex. No. | Fluoroalkyl acrylate Kind | Fluoroalkyl acrylate part | Fluoroalkyl acrylate part by mole | GMA part | GMA part by mole | Tg °C. | [$\eta$] dl./g. |
|---|---|---|---|---|---|---|---|
| 8 | $CH_2=C(CH_3)COOCH_2CF_2CHF_2$ | 99 | 98.6 | 1 | 1.4 | 75 | 1.10 |
| 9 | $CH_2=C(CH_3)COOC(CH_3)_2CF_2CHCF_2$ | 99 | 98.4 | 1 | 1.6 | 41 | 0.91 |
| 10 | $CH_2=C(CH_3)COOCH(C_2H_5)CF_2CHFCF_3$ | 99 | 98.4 | 1 | 1.6 | 48 | 0.80 |

REFERENCE EXAMPLE 11

The procedure of Example 2 was repeated except that glycidyl acrylate was employed instead of GMA, namely HFBMA and glycidyl acrylate were employed in a ratio of 98.1:1.9 by mole, to give 52 parts of a copolymer.

The copolymer had an intrinsic viscosity [$\eta$] of 1.02 dl./g.

REFERENCE EXAMPLE 12

To 99 parts (97.1% by mole) of HFBMA were added 1 part (2.9% by mole) of methacrylic acid (hereinafter referred to as "MA") and 0.1 part of AIBN, and they were mixed. After degasing, copolymerization was carried out at 60° C. for 24 hours. After adding acetone to the reaction mixture to give a uniform solution, a copolymer was precipitated by adding petroleum ether to the solution to give 68 parts of the copolymer.

It was confirmed by pyrolysis gas chromatography that the obtained copolymer contained 3.0% by mole of MA monomer units and had approximately the same composition as that of the charged monomers. The intrinsic viscosity [η] of the copolymer measured at 35° C. by employing a methyl ethyl ketone solution of the copolymer was 1.13, and the weight average molecular weight of the copolymer measured by gel permeation chromatography was about 1,000,000.

REFERENCE EXAMPLES 13 TO 15

The procedure of Reference Example 12 was repeated except that the amounts of HFBMA, MA and AIBN were changed as shown in Table 3.

The results are shown in Table 3.

TABLE 3

| Ref. Ex. No. | HFBMA mole % | MA mole % | AIBN part | [η] | Weight average molecular weight |
|---|---|---|---|---|---|
| 13 | 86.8 | 13.2 | 0.1 | 1.10 | about 1,100,000 |
| 14 | 75.6 | 24.4 | 0.1 | 0.80 | about 800,000 |
| 15 | 97.1 | 2.9 | 0.05 | 2.1 | about 2,500,000 |

REFERENCE EXAMPLE 16

A copolymer was prepared in the same manner as in Reference Example 12 except that 100 parts of a monomer mixture of 97.3% by mole of 2,2,3,3-tetrafluoro-1,1-dimethylpropyl methacrylate and 2.7% by mole of MA was employed. The copolymer had an intrinsic viscosity of 1.12.

REFERENCE EXAMPLE 17

A copolymer was prepared in the same manner as in Reference Example 12 except that 100 parts of a monomer mixture of 97.1% by mole of HFBMA and 2.9% by mole of acrylic acid was employed. The copolymer had an intrinsic viscosity of 0.89.

REFERENCE EXAMPLE 18

To 99 parts (97.1 parts by mole) of HFBMA were added 1 part (2.9 parts by mole) of methacrylamide (hereinafter referred to as "MAA"), 0.1 part of AIBN, 0.025 part of dodecyl mercaptan and 100 parts of methyl isobutyl ketone, and they are mixed. After degasing, copolymerization was carried out at 60° C. for 24 hours. After adding acetone to the reaction mixture to give a uniform solution, a copolymer was precipitated by adding petroleum ether to the solution to give 93 parts of the copolymer.

It was confirmed by pyrolysis gas chromatography that the copolymer contained 3.0% by mole of MAA monomer units and had approximately the same composition as that of the charged monomers. The intrinsic viscosity [η] of the copolymer measured at 35° C. by employing a methyl ethyl ketone solution of the copolymer was 0.39, and the weight average molecular weight of the copolymer measured by gel permeation chromatography was about 550,000.

REFERENCE EXAMPLE 19

A copolymer was prepared in the same manner as in Reference Example 18 except that 90 parts of HFBMA and 10 parts of MAA were employed.

REFERENCE EXAMPLE 20

The procedure of Reference Example 18 was repeated except that 2,2,3,3-tetrafluoro-1,1-dimethylpropyl methacrylate and acrylamide were employed instead of HFBMA and MAA, respectively, and AIBN was employed in an amount of 0.05 part, to give a copolymer having an intrinsic viscosity of 1.10.

REFERENCE EXAMPLE 21

To 99 parts (97.8 parts by mole) of HFBMA were added 1 part (2.2 parts by mole) of methyl α-cyanoacrylate (hereinafter referred to as "CN-MMA") and 0.1 part of AIBN, and they were mixed. After degasing, copolymerization was carried out at 70° C. for 24 hours. After adding acetone to the reaction mixture to give a uniform solution, a copolymer was precipitated by adding petroleum ether to the solution to give 87 parts of the copolymer.

It was confirmed by pyrolysis gas chromatography that the copolymer contained 2.1% by mole of CN-MMA monomer units and had approximately the same composition as that of the charged monomers. The intrinsic viscosity [η] of the copolymer measured at 35° C. by employing a methyl ethyl ketone solution of the copolymer was 1.39, and the weight average molecular weight of the copolymer measured by gel permeation chromatography was about 120,000.

REFERENCE EXAMPLE 22

A copolymer was prepared in the same manner as in Reference Example 21 except that 95 parts of 2,2,3,3-tetrafluoro-1,1-dimethylpropyl methacrylate and 5 parts of ethyl α-cyanoacrylate were employed as monomers.

EXAMPLE 1

To 4 parts of the copolymer of HFBMA and GMA obtained in Reference Example 2 was added 46 parts of methyl isobutyl ketone to give a uniform resist solution. A resist film having a thickness of 0.5 μm. was formed on a silicon wafer by coating the solution on the wafer by a spin coater, heating at 140° C. for 30 minutes to evaporate the solvent and cooling to ordinary temperature.

The electron beam delineation of the resist film was carried out by employing a ERE-302 type electron beam delineation apparatus made by Kabushiki Kaisha Elionix, Japan. Electron beams (current density: $1 \times 10^{-9}$ A/cm.$^2$, acceleration voltage: 20 kV) were irradiated to several portions of the resist film for 0.08 second (electron base dose: $1.9 \times 10^{-7}$ (coulomb/cm.$^2$) to 125 seconds (electron beam dose: $2.9 \times 10^{-4}$ coulomb/cm.$^2$). The irradiated resist film was then immersed in a mixed solvent of methyl isobutyl ketone and isopropanol (1.5:98.5 by volume) of 23° C. for 90 seconds to develop resist patterns, and was immediately washed by immersing in isopropanol of 23° C. for 60 seconds and dried.

Figure 1:
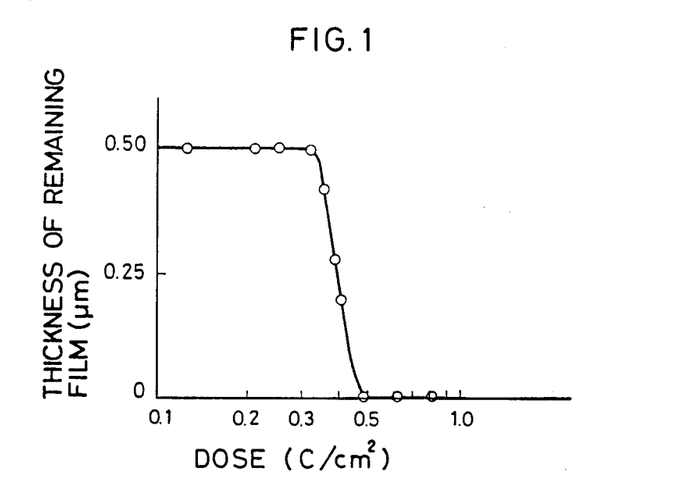
FIG. 1 is a graph showing the relationship between electron beam dose and thickness of remaining resist film in irradiation with electron beams of the resist film of the present invention.

The remaining film thickness of the patterned portions was measured by employing a Talystep made by Rank Taylor Hobson, England. The relationship between the dose of electron beam (coulomb/cm.$^2$) and the thickness of the remaining film (μm.) is shown in FIG. 1. It is found from FIG. 1 that the resist has a sensitivity of $0.47 \times 10^{-6}$ coulomb/cm.$^2$ and a γ value of 7.6.

Also, the resist film was delineated with electron beam of $0.47 \times 10^{-6}$ coulomb/cm.$^2$ to form patterns of 2, 3 and 5 μm. line and space, and the development, washing and drying were conducted in the same manner as above. The obtained resist patterns were observed with an optical microscope of 400 magnifications to evaluate the adhesion property. It was confirmed that all patterns completely adhered to the wafer.

◯: Complete close adhesion is observed in all of the patterns.

TABLE 4

| Ref. Ex. No. | Polymer GMA content (mole %) | Content of MIBK in developer (vol. %) | Sensitivity (C./cm$^2$) | $\gamma$ value | Adhesion property |
|---|---|---|---|---|---|
| Ex. 2 | 5 | 19 | 50 | $2.3 \times 10^{-5}$ | 1.7 | ◯ |
| Ex. 3 | 1 | 8.5 | 2.5 | $2.9 \times 10^{-6}$ | 5.5 | ◯ |
| Ex. 4 | 4 | 2.6 | 1.0 | $1.2 \times 10^{-6}$ | 10 | ◯ |
| Ex. 5 | 3 | 0.87 | 1.0 | $1.0 \times 10^{-6}$ | 10 | Δ |
| Com. Ex. 1 | HFBMA homopolymer | | 0.66 | $4.0 \times 10^{-7}$ | 4.5 | X |

EXAMPLES 2 TO 5

The procedure of Example 1 was repeated except that the copolymers obtained in Reference Examples 5, 1, 4 and 3 were employed, respectively, instead of the copolymer obtained in Reference Example 2 and a mixed solvent of methyl isobutyl ketone (MIBK) and isopropanol as shown in Table 4 was employed as a developer. The sensitivity, $\gamma$ value and adhesion property of the resist films are shown in Table 4.

COMPARATIVE EXAMPLE 1

The procedure of Example 1 was repeated except that a HFBMA homopolymer having an intrinsic viscosity of 0.8 and a weight average molecular weight of about 800,000 was employed instead of the copolymer obtained in Reference Example 2 and a methyl isobutyl ketone-isopropanol mixed solvent shown in Table 4 was employed as a developer.

The sensitivity, $\gamma$ value and adhesion property of the resist film are shown in Table 4.

The adhesion property was evaluated as follows: A resist film was irradiated with electron beam of a dosage corresponding to the sensitivity of the resist film to form patterns of 2, 3 and 5 μm. line and space, and was developed with the respective developer followed by washing and drying. The obtained resist patterns were observed with an optical microscope of 400 magnifications, and the adhesion property was evaluated according to the following criterion:

X: Peeling off is observed in at least a part of the patterns.

Δ: A slight blister is observed in any part of the patterns.

EXAMPLES 6 AND 7

The procedure of Example 1 was repeated except that the copolymers obtained in Reference Examples 6 and 7 were employed, respectively, instead of the copolymer obtained in Reference Example 2 and a methyl isobutyl ketone-isopropanol mixed solvent having a methyl isobutyl ketone content shown in Table 5 was employed as a developer.

The sensitivity, $\gamma$ value and adhesion property of the resist films are shown in Table 5, in which the mark "●" show that the measurement was impossible due to swelling or dissolution of the resist film in the developer.

TABLE 5

| Ref. Ex. No. | Polymer GMA content (mole %) | Content of MIBK in developer (vol. %) | Sensitivity (C./cm$^2$) | $\gamma$ value | Adhesion property |
|---|---|---|---|---|---|
| Ex. 6 | 6 | 1.39 | 1.0 | $1.6 \times 10^{-6}$ | 10 | ◯ |
| | | | 1.5 | $4.7 \times 10^{-7}$ | 10 | ◯ |
| | | | 2.0 | $1.6 \times 10^{-7}$ | 10 | ◯ |
| | | | 2.5 | ● | ● | ● |
| Ex. 7 | 7 | 2.4 | 2.5 | $8.0 \times 10^{-8}$ | 10 | ◯ |

EXAMPLES 8 TO 10

The procedure of Example 1 was repeated except that the copolymers obtained in Reference Examples 8 to 10 were employed, respectively, instead of the copolymer obtained in Reference Example 2 and the developers shown in Table 6 were employed.

The results are shown in Table 6.

TABLE 6

| Ex. No. | Polymer | Developer (by volume) | Sensitivity (C./cm$^2$) | $\gamma$ value | Adhesion property |
|---|---|---|---|---|---|
| 8 | Ref. Ex. 8 | methyl cellosolve acetate/n-propanol (1/6) | $4 \times 10^{-6}$ | 2.5 | ◯ |
| 9 | Ref. Ex. 9 | butyl cellosolve/ isopropanol (1/4) | $2.7 \times 10^{-6}$ | 2.5 | ◯ |
| 10 | Ref. Ex. 10 | methyl isobutyl ketone/ isopropanol (1/99) | $1.2 \times 10^{-6}$ | 5.5 | ◯ |

EXAMPLE 11

The procedure of Example 1 was repeated except that the copolymer obtained in Reference Example 11 was employed instead of the copolymer obtained in Reference Example 2. The sensitivity was $0.56 \times 10^{-6}$ coulomb/cm.$^2$ and the $\gamma$ value was 5.5. Also, the resist pattern completely adhered to the substrate and the adhesion property was excellent.

EXAMPLE 12 AND COMPARATIVE EXAMPLES 2 AND 3

A resist film having a thickness of 0.43 μm. was formed in the same manner as in Example 6. The electron beam delineation was carried out by irradiating the resist film with electron beam of $2 \times 10^{-6}$ coulomb/cm.$^2$ to form many square patterns each having a size of $0.5 \times 0.5$ μm. The development of the delineated film was then conducted by immersing the film in a methyl isobutyl ketone/isopropanol mixed solvent (1.25/100 by volume) for 2 minutes, and the film was washed at 20° C. by immersing in isopropanol for 1 minute and in n-butyl alcohol for 2 minutes and was then dried. The patterns were observed with an electron microscope. The observed patterns are shown in FIG. 2A.

Further, with respect to a resist film obtained in the same manner as in Comparative Example 1, the electron beam delineation was carried out by irradiating the resist film with electron beam of $2 \times 10^{-6}$ coulomb/cm.$^2$ to form many square patterns each having a size of $0.75 \times 0.75$ μm. (Comparative Example 2) or each having a size of $1 \times 1$ μm. (Comparative Example 3). The delineated film was developed by immersing in a methyl isobutyl ketone/isopropanol mixed solvent (1/150 by volume) for 2 minutes, washed by immersing in isopropanol for 1 minute and in n-butyl alcohol for 2 minutes, and dried. The patterns were observed with an electron microscope. The observed patterns are shown in FIG. 2B (Comparative Example 2) and FIG. 2C (Comparative Example 3).

Figure 2A:
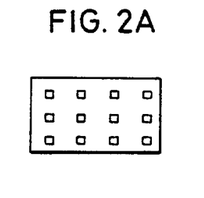
FIGS. 2A, 2B and 2C are views showing different fine resist patterns observed by a microscope.
Figure 2B:
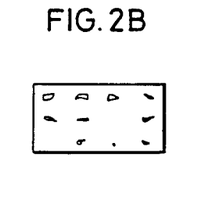
Figure 2C:
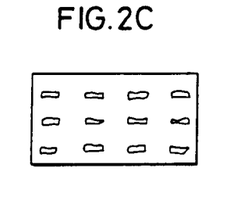

As is understood from comparison of FIG. 2A with FIGS. 2B and 2C, peeling off, blister and shrinkage of the patterns are observed in the resist film made of the HFBMA homopolymer, whereas peeling off, blister and shrinkage of the patterns are not observed in the resist film according to the present invention despite of $0.5 \times 0.5$ μm. square patterns which are finer than those of Comparative Examples 2 and 3 and the square patterns completely adhere to the substrate.

EXAMPLE 13

To 4 parts of the HFBMA-MA copolymer obtained in Reference Example 12 was added 46 parts of methyl isobutyl ketone to prepare a uniform resist solution. A resist film having a thickness of 0.8 μm, was formed on a silicon wafer by spin coating, heating at 140° C. for 30 minutes to evaporate the solvent and cooling to ordinary temperature.

The electron beam delineation of the resist film was carried out by employing a ERE-302 type electron beam delineation apparatus made by Kabushiki Kaisha Elionix, Japan. Electron beams (current density: $1 \times 10^{-9}$ A/cm.$^2$, acceleration voltage: 20 kV) were irradiated to several portions of the resist film for 0.08 second (electron beam dose: $1.9 \times 10^{-7}$ coulomb/cm.$^2$) to 125 seconds (electron beam dose: $2.9 \times 10^{-4}$ coulomb/cm.$^2$). The irradiated resist film was then immersed in an isopropanol/n-heptane mixed solvent (25/10 by volume) of 23° C. for 90 seconds to develop resist patterns, and it was immediately washed by immersing in n-heptane of 23° C. for 60 seconds and dried.

Figure 3:
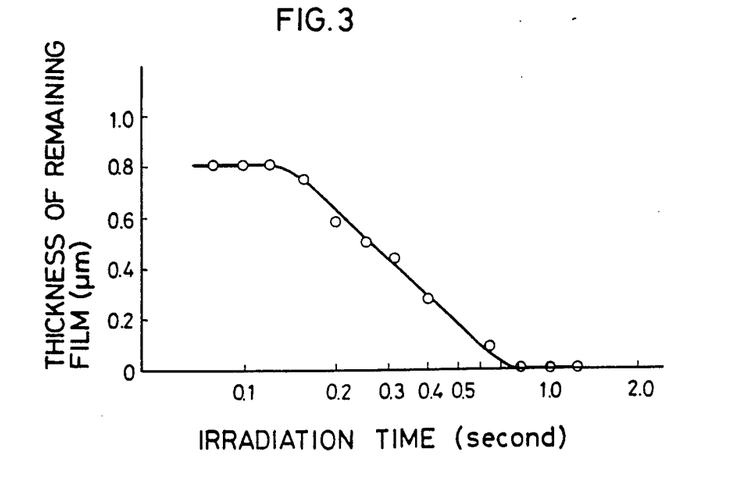
FIGS. 3, 4 and 5 are graphs showing the relationship between irradiation time and thickness of remaining resist film in irradiation with electron beam of the resist films of the present invention.

The remaining film thickness of the patterned portions was measured by employing a Talystep made by Rank Taylor Hobson, England. The relationship between the electron beam irradiation time (second) and the remaining film thickness (μm.) is shown in FIG. 3. It is found from FIG. 3 that the resist has a sensitivity of $1.9 \times 10^{-6}$ coulomb/cm.$^2$ and a γ value of 1.4.

Also, the resist film was delineated with electron beam of $1.9 \times 10^{-6}$ coulomb/cm.$^2$ to form patterns of 2, 3 and 5 μm. line and space, and the development, washing and drying was conducted in the same manner as above. The obtained resist patterns were observed with an optical microscope of 400 magnifications to evaluate the adhesion property. It was confirmed that all line patterns completely adhered to the substrate.

EXAMPLES 14 TO 19

The procedure of Example 13 was repeated except that the copolymer, developer and washing liquid were replaced with those shown in Table 7.

The sensitivity, γ value and adhesion property of the resist films are shown in Table 7.

COMPARATIVE EXAMPLE 4

The procedure of Example 1 was repeated except that a resist film having a thickness of 0.5 μm. was formed by employing a HFBMA homopolymer having an intrinsic viscosity of 0.8 and a weight average molecular weight of about 800,000 instead of the copolymer obtained in Reference Example 12 and the developer and washing liquid shown in Table 7 were employed.

The results are shown in Table 7.

TABLE 7

| | Polymer | Developer Kind | Developer volume ratio | Washing liquid | Sensitivity (C./cm$^2$) | γ value | Adhesion property |
|---|---|---|---|---|---|---|---|
| Ex. 14 | Ref. Ex. 12 | isopropanol/water | 97.5/2.5 | n-heptane | $3.7 \times 10^{-7}$ | 1.2 | O |
| Ex. 15 | Ref. Ex. 13 | isopropanol/n-heptane | 43/57 | " | $4.6 \times 10^{-6}$ | 0.7 | O |
| Ex. 16 | Ref. Ex. 14 | isopropanol/n-heptane | 25/75 | " | $1 \times 10^{-5}$ | 0.7 | O |
| Ex. 17 | Ref. Ex. 15 | isopropanol/n-octane | 75/25 | n-octane | $4.6 \times 10^{-6}$ | 1.4 | O |
| Ex. 18 | Ref. Ex. 16 | n-butanol/n-heptane | 50/50 | n-heptane | $1 \times 10^{-5}$ | 1.12 | O |
| Ex. 19 | Ref. Ex. 17 | n-propanol/n-hexane | 25/10 | " | $2.3 \times 10^{-6}$ | 1.12 | O |
| Com. Ex. 4 | HFBMA homopolymer | methyl isobutyl ketone/isopropanol | 0.66/99.34 | isopropanol | $4.0 \times 10^{-7}$ | 4.5 | X |

EXAMPLE 20

A resist solution was prepared by dissolving 4 parts of the HFBMA-MAA copolymer obtained in Reference Example 18 in 46 parts of methyl isobutyl ketone, and a resist film having a thickness of 0.5 μm. was formed on a silicon wafer by coating the resist solution with a spin coater, heating at 140° C. for 30 minutes to evaporate the solvent and cooling to ordinary temperature.

Figure 4:
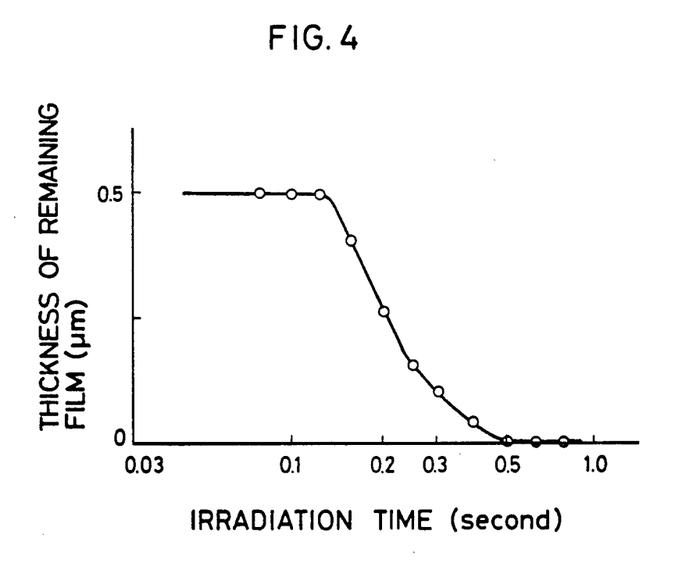

The electron beam delineation of the resist film was carried out in the same manner as in Example 1. The delineated resist film was developed by immersing in an isopropanol/n-hetane mixed solvent (85/15 by volume) of 23° C. for 90 seconds, and it was immediately washed by immersing in n-heptane of 23° C. for 60 seconds and dried. The remaining film thickness of the patterned portions was measured. The relationship between the electron beam irradiation time (second) and the remaining film thickness is shown in FIG. 4. It is found from FIG. 4 that the resist has a sensitivity of $1.2 \times 10^{-6}$ coulomb/cm.$^2$ and a γ value of 2.62.

Also, the resist film was delineated with electron beam of $0.47 \times 10^{-6}$ coulomb/cm.$^2$ to form patterns of 2, 3 and 5 μm. line and space, and the development, washing and drying were conducted in the same manner as above. It was observed with an optical microscope of 400 magnifications that all line patterns completely adhered to the substrate and the adhesion property was excellent.

EXAMPLE 21

The procedure of Example 20 was repeated except that isopropanol containing 1.25% by weight of water was employed as a developer instead of the isopropanol/n-heptane mixed solvent. The resist film had a sensitivity of $1 \times 10^{-6}$ coulomb/cm.$^2$, a γ value of 2.0 and an excellent adhesion property.

EXAMPLE 22

The procedure of Example 20 was repeated except that the copolymer obtained in Reference Example 19 was employed as a resist material and an isopropanol/n-octane mixed solvent (1/5 by volume) was employed as a developer. The resist film had a sensitivity of $2.9 \times 10^{-5}$ coulomb/cm.$^2$, a γ value of 1.2 and an excellent adhesion property.

EXAMPLE 23

The procedure of Example 20 was repeated except that the copolymer obtined in Reference Example 20 was employed as a resist material. The resist film had a sensitivity of $2.0 \times 10^{-4}$ coulomb/cm.$^2$, a γ value of 1.4 and an excellent adhesion property.

EXAMPLE 24

A resist solution was prepared by dissolving 4 parts of the HFBMA/CN-MMA copolymer obtained in Reference Example 21 in 46 parts of methyl isobutyl ketone, and a resist film having a thickness of 0.8 μm, was formed on a silicon wafer by coating the resist solution with a spin coater, heating at 140° C. for 30 minutes to evaporate the solvent and cooling to ordinary temperature.

Figure 5:
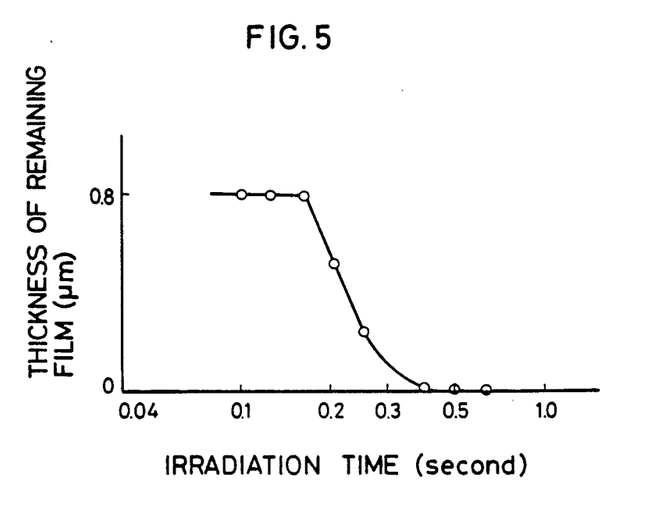

The electron beam delineation of the resist film was carried out in the same manner as in Example 1 by employing the ERE-302 type electron beam delineation apparatus. The delineated resist film was developed by immersing in a methyl isobutyl ketone/isopropanol mixed solvent (1.5/98.5 by volume) of 23° C. for 90 seconds, and it was immediately washed by immersing in isopropanol of 23° C. for 60 seconds and dried. The remaining film thickness of the patterned portions was measured. The relationship between the electron beam irradiation time (second) and the remaining film thickness is shown in FIG. 5. It is found from FIG. 5 that the resist has a sensitivity of $1.20 \times 10^{-6}$ coulomb/cm.$^2$ and a γ value of 4.05.

Also, the resist film was delineated with electron beam of $1.20 \times 10^{-6}$ coulomb/cm.$^2$, and the development, washing and drying were conducted in the same manner as above. The obtained resist patterns were observed with an optical microscope of 400 magnifications, and it was found that all patterns completely adhered to the substrate and the adhesion property was excellent.

EXAMPLE 25

The procedure of Example 24 was repeated except that a methyl cellosolve acetate/isopropanol mixed solvent (15/85 by volume) was employed as a developer. The resist film had a sensitivity of $1.6 \times 10^{-5}$ coulomb/cm.$^2$, a γ value of 2.5 and an excellent adhesion property.

In addition to the ingredients used in the Examples, other ingredients can be used in the Examples as set forth in the specification to obtain substantially the same results.

What we claim is:

1. A process for forming fine resist patterns which comprises irradiating portions of a positive resist film with high energy rays, the positive resist film being made of a copolymer of a fluoroalkyl acrylate having the general formula (I):

wherein $R_1$ is methyl group, ethyl group, a halogen-substituted methyl or ethyl group, a halogen atom or hydrogen atom, $R_2$ is a bivalent hydrocarbon group having 1 to 6 carbon atoms, and $R_f$ is a fluoroalkyl group having 1 to 15 carbon atoms, and an acrylic comonomer selected from the group consisting of a glycidyl acrylate having the general formula (II):

wherein $R_3$ is hydrogen atom, methyl group or ethyl group, an acrylic acid having the general formula (III):

wherein $R_3$ is as defined above,
an acrylamide having the general formula (IV):

wherein $R_3$ is as defined above,
and an α-cyanoacrylate having the general formula (V):

wherein $R_4$ is hydrogen atom or an alkyl group having 1 to 5 carbon atoms, the ratio of the fluoroalkyl acrylate (I) to the acrylic comonomer being from 80:20 to 99.9:0.1 by mole and conducting development with a developer to remove only the irradiated portions of the positive resist film.

2. The process of claim 1, wherein said copolymer is a copolymer of the fluoroalkyl acrylate (I) with an acrylic comonomer selected from the group consisting of the glycidyl acrylate (II) and the α-cyanoacrylate (V).

3. The process of claim 2, wherein the developer is an alcohol having 3 to 8 carbon atoms.

4. The process of claim 2, wherein the developer is a mixture of an alcohol having 3 to 8 carbon atoms with an organic solvent selected from the group consisting of a ketone, an alkyl cellosolve having a $C_1$ to $C_5$ alkyl group and an alkyl alkanate having a $C_1$ to $C_5$ alkyl group and a $C_1$ to $C_5$ alkanate group.

5. The process of claim 2, wherein the developer is a mixture of an alcohol selected from the group consisting of isopropyl alcohol and n-propyl alcohol with a solvent selected from the group consisting of methyl isobutyl ketone, methyl cellosolve, ethyl cellosolve, methyl cellosolve acetate and ethyl cellosolve acetate.

6. The process of claim 1, wherein said copolymer is a copolymer of the fluoroalkyl acrylate (I) with an acrylic comonomer selected from the group consisting of the acrylic acid (III) and the acrylamide (IV).

7. The process of claim 6, wherein the developer is an alcohol having 2 to 8 carbon atoms.

8. The process of claim 6, wherein the developer is a mixture of an alcohol having 2 to 8 carbon atoms with a hydrocarbon having 5 to 11 carbon atoms or water.

9. The process of claim 6, wherein the developer is a mixture of an alcohol selected from the group consisting of isopropyl alcohol and n-propyl alcohol with a solvent selected from the group consisting of hexane, heptane, octane, nonane, benzene, cyclohexane and water.

* * * * *